US006860742B2

(12) United States Patent
Shimada

(10) Patent No.: US 6,860,742 B2
(45) Date of Patent: Mar. 1, 2005

(54) SOCKET FOR ELECTRICAL PARTS HAVING SPACER

(75) Inventor: Hideo Shimada, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/627,869

(22) Filed: Jul. 28, 2003

(65) Prior Publication Data

US 2004/0023526 A1 Feb. 5, 2004

(30) Foreign Application Priority Data

Aug. 2, 2002 (JP) ....................................... 2002-226493

(51) Int. Cl.[7] ........................ H01R 12/00; H01R 13/00; H05K 1/00

(52) U.S. Cl. ............................ 439/70; 439/69; 439/483

(58) Field of Search .......................... 439/70, 482, 483, 439/700, 69

(56) References Cited

U.S. PATENT DOCUMENTS

| | | | | |
|---|---|---|---|---|
| 4,391,479 A | * | 7/1983 | Wessel | 439/45 |
| 5,990,697 A | * | 11/1999 | Kazama | 324/761 |
| 6,033,250 A | * | 3/2000 | Pauza | 439/357 |
| 6,655,983 B1 | * | 12/2003 | Ishikawa et al. | 439/482 |

* cited by examiner

*Primary Examiner*—Chandrika Prasad
(74) *Attorney, Agent, or Firm*—Staas & Halsey LLP

(57) ABSTRACT

A socket for electrical parts, which is mounted on a circuit board, comprises a socket body on which the electrical part is accommodated, and a plurality of contactors disposed on the socket body for establishing an electrical connection between the circuit board and the electrical part. The socket body comprises a contact unit in which the contactors are held and the contact unit is comprised of plates to be superimposed. Each plate has a plurality of through holes through each of which the contactor is inserted. A hole size of the through holes of one plate being different from that of another plate which is directly disposed on the one plate so as to form a stepped portion between the through holes of the one plate and another plate. The stepped portion is used for preventing the contactor from coming off from the contact unit.

12 Claims, 18 Drawing Sheets

PRIOR ART

SOCKET FOR ELECTRICAL PARTS HAVING SPACER

BACKGROUND OF THE INVENTION

1. Field of the Invention

The present invention relates to a socket for electrical parts for detachably accommodating and holding an electrical part such as a semiconductor device (called as "IC package" hereinlater), to conduct an electric performance test and examination of such electrical part.

2. Related Art of the Invention

As a conventional "socket for electrical part," there have been provided an IC socket for detachably holding an IC package as "electrical part."

The IC package includes, for example, one having a plurality of terminals on a lower surface of strip like package body.

On a socket body of the IC socket, a plurality of probe pins are provided. The probe pin is designed to establish an electrical connection between a printed circuit board and the IC package terminal.

As a conventional probe pin, there is, for example, one which comprises a vertically movable upper side contact member and a lower side contact member disposed at an upper and lower inner sides of a tubular member and a spring disposed between both contact members. Both contact members are urged by the spring to push away from each other.

The probe pin is designed to be accommodated in the socket body. FIG. 18 shows an example of the accommodating structure. That is, the structure has 2 plates, plates 1 and 2. In the plates 1 and 2, holes 1*a* and 2*a* with stepped portion are formed, respectively. When the plates 1 and 2 are superimposed, the probe pin can be accommodated in a pair of step holes 1*a* and 2*a*.

After the probe pin is accommodated in the pair of step holes 1*a* and 2*a*, the probe pin is prevented from coming off upward or downward by the existence of the stepped portions 1*b* and 2*b*.

The plates 1 and 2 are usually produced by molding of resin using a mold die. In these days, however, increasing number of IC packages are made by small-lot production. Therefore preparing a mold die which can only be used for producing a socket for electrical part to be made by the small-lot production may cause increase in production cost, being uneconomical.

In order to bring down the cost of the socket for electrical part to be produced by the small-lot production, some socket parts made of the same resin as used in the same molded parts is considered to be produced through machine work, for example, a cutting process etc. instead of molding processes using mold dies.

But, when a number of stepped holes 1*a*, 2*a* is made, through cutting work, in the above mentioned plates 1 and 2, it is difficult to make a depth (or height) D constant of the larger diameter hole of the stepped holes 1*a* and 2*a*. Therefore, there occurs a problem of dimensional difference (dispersion) in the stepped portion 1*b*, 2*b* of the stepped holes 1*a*, 2*a*.

In a case where the probe pin is installed in such conventional plates 1, 2 and used as a socket, there is a fear that performance test of the IC package can not be carried out stably and certainly because contact pressure of the probe pin tends to fluctuate and can not be controlled within a prescribed range.

The dimensional difference arisen from the cutting process of the stepped holes 1*a*, 2*a* of the plates 1, 2 grows larger as the number of terminals increases.

In addition, in the conventional socket for electrical parts, the plates 1, 2 are made of a synthetic resin having excellent insulation performance and physical strength, so that the thermal expansion coefficient of the synthetic resin is larger than that of the insulating material (for example, epoxy resin with glass fiber substrate, etc.) of the printed circuit board. The amount of deformation of the plates 1, 2 is different from that of the circuit board at a high temperature during burn in testing. There is a fear that the pitch of the stepped holes 1*a*, 2*a* of the plates 1, 2 into which probe pin is accommodated is different from that of an electrode on the circuit board against which the probe pin abuts. If the burn-in testing is conducted under the condition that the probe pin is slightly misaligned from a prescribed position of the electrode of the circuit board, electrical connection between the probe pin and the electrode of the printed circuit board may not be established at worst. Concerns mentioned above grow larger in these days, as the number of terminals of the IC package is increasing and the pitch of the terminals becomes narrower.

SUMMARY OF THE INVENTION

An object of the present invention is to provide a socket for electrical parts by using a contactor-accommodating member which can be produced precisely by machine work such as cutting process etc. instead of molding using a mold die. Another object of the present invention is to provide a socket for electrical parts which can be used for IC packages having a large number of terminals and a narrow terminal pitch and capable of positioning and mounting a contactor precisely with respect to and on the electrode of the circuit board, the contactor being able to correspond to the terminal of the IC package having a large number of and a narrow pitch of the terminal.

This and other objects can be achieved according to the present invention. A first aspect of the present invention can be achieved by providing a socket for electrical parts, which is mounted on a circuit board, comprising:

a socket body on which the electrical part is accommodated; and a plurality of contactors disposed on the socket body for establishing an electrical connection between the circuit board and the electrical part, the socket body comprising a contact unit in which the contactors are held, the contact unit being comprised of plates to be superimposed, each plate having a plurality of through holes through each of which the contactor is inserted, a hole size of the through holes of one plate being different from that of another plate which is directly disposed on the one plate so as to form a stepped portion between the through holes of the one plate and another plate, the stepped portion being used for preventing the contactor from coming off from the contact unit.

Another aspect of the present invention is that the contact unit comprises:

an upper plate disposed at an uppermost position;

a lower plate disposed at a lowermost position; and an intermediate plate disposed between the upper plate and the lower plate, a hole size of the through holes of the intermediate plate being formed to be larger than that of the upper plate so as to form the stepped portion, a hole size of the through hole of the intermediate plate being formed to be larger than that of the lower plate so as to form the stepped portion.

Still another aspect of the present invention is that the contact unit comprises:

a first plate disposed at an uppermost position;

a second plate disposed under the first plate;

a fourth plate disposed at a lowermost position;

a third plate disposed over the fourth plate; and a spacer plate disposed between the second plate and the third plate, a hole size of the through hole of the second plate being larger than that of the first plate so as to form the stepped portion, a hole size of the through hole of the third plate being larger than that of the fourth plate so as to form the stepped portion, a through hole into which the contactor is inserted is formed in the spacer plate.

Another aspect of the present invention is that the socket body comprises a socket frame and a contact unit, the socket frame having an opening capable of accommodating the contact unit, the contact unit is detachably disposed on the socket frame.

Another aspect of the present invention is that the plate of the contact unit is formed of the same material having an approximately same thermal expansion coefficient as that of an insulating material of the circuit board.

Another aspect of the present invention is that a positioning portion is formed, with respect to the circuit board, on the contact unit, the contact unit being positioned on the circuit board by the positioning portion.

According to the first aspect of the present invention, the socket body has the contact unit in which a plurality of contactors is held. The contact unit comprises a plurality of plates which are superimposed. These plates each has a plurality of through holes into each of which each contactor is inserted. Hole size of the through hole of one plate is different from the hole size of another through hole of another plate which is superposed on the one plate so as to form the stepped portion between the through hole of the one plate and the another through hole. The stepped portion is used for preventing the contactor from coming off.

Each through hole can be formed accurately (precisely) by adapting cutting work (process) to these plates. And, by changing hole size of the through hole of each plate, the stepped portion can be formed so that forming a conventional stepped hole in one sheet of plates is no longer required. Therefore there is no need to use expensive mold dies so that the present invention can meet the recent demand of testing IC packages made by large item small scale production system. The invention can also meet the recent trend of increasing in the number of pins of the electrical parts and narrowing of the pitch of the terminals.

According to another aspect of the present invention, the contact unit has the upper plate disposed at the uppermost position, the lower plate disposed at the lowermost position, and the intermediate plate interposed between the upper and the lower plates. The hole size of the through hole of the intermediate plate is formed to be larger than that of the upper plate so that the stepped portion can be formed between the through holes of the intermediate and the upper plate. The hole size of the through hole of the intermediate plate is formed to be larger than that of the lower plate so that the stepped portion can be formed between the through holes of the intermediate and the lower plate. Thereby the contactor can be held in the through holes without coming off from the contact unit using the minimum number of plates.

According to still another aspect of the present invention, the contact unit has the first plate disposed at the uppermost position, the second plate disposed under the first plate, the fourth plate disposed at the lowermost position, the third plate disposed over the fourth plate, and the spacer plate disposed between the second and the third plate. The hole size of the through hole of the second plate is formed to be larger than that of the first plate so that the stepped portion can be formed between the through holes of the first and the second plates. The hole size of the through hole of the third plate is formed to be larger than that of the fourth plate so that the stepped portion can be formed between the through holes of the third and the fourth plates. Since the spacer plate has the through hole, through which the contactors can be passed, and is interposed between the second and the third plates, the contactor having different length can be accommodated into the contact unit by only replacing the spacer plate with another spacer plate having different thickness, without changing the thickness of the first to fourth plates. In other words, with the dimensional accuracy of the stepped portion being kept constant, a variety of contactors having different length can be accommodated into the contact unit.

According to another aspect of the present invention, the socket body has the socket frame and the contact unit. And the socket frame has the opening into which the contact unit can be accommodated. And the contact unit is detachably disposed to the socket frame so that replacing the contact unit can be easily carried out.

According to the still another aspect of the present invention, the material of the plates of the contact unit and the insulating material of the printed circuit board have approximately same thermal expansion coefficient so that the difference of the thermal expansion coefficient between the circuit board side and the contact unit side can be made minimal. Therefore, the positional relationship between the contactors on the contact unit side and the electrodes on the circuit board side can be kept within a predetermined range.

According to another aspect of the present invention, the positioning portion is formed on the contact unit with respect to the circuit board. The contact unit is mounted on the circuit board and positioned by the positioning portion so that the contactors of the contact unit can be positioned, on the electrodes of the circuit board, with a prescribed positional relationship between the contactors and the electrodes.

Another aspect of the another present invention is that a socket for electrical parts, which is disposed on a circuit board, comprising:

a socket body on which the electrical part is accommodated; and a plurality of contactors disposed on the socket body for establishing an electrical connection between the circuit board and the electrical part, the socket body comprising a contact unit in which the contactors are held, a positioning portion being formed, with respect to the circuit board, on the contact unit, the contact unit being positioned on the circuit board by the positioning portion.

Still another aspect of the another invention is that the socket body comprises a socket frame and a contact unit, the socket frame having an opening capable of accommodating the contact unit, the contact unit is detachably disposed on the socket frame.

Another aspect of the present invention is that the contactor elastically abutting against the circuit board so as to establish an electrical connection therebetween.

According to another aspect of another invention, the socket body has the contact unit holding a plurality of contactors. The positioning portion with respect to the circuit board is provided with the contact unit. The contact unit is mounted on the circuit board and positioned by the positioning portion so that the contactors of the contact unit and the electrodes of the circuit board, can be positioned with a prescribed positional relationship.

According to another aspect of another invention, the socket body has the socket frame and the contact unit. The socket frame has the opening of the size capable of accommodating the contact unit. The contact unit can be detachably disposed in the socket frame so that the contact unit can be easily replaced with another one.

The nature and further characteristic features of the present invention will be made more clear from the following descriptions made with reference to the accompanying drawings.

BRIEF DESCRIPTION OF THE DRAWINGS

In the accompanying drawings:

FIG. 10A is a plan view and FIG. 10B is a front view;

FIG. 11A is a plan view and FIG. 11B is a front view;

FIG. 12A is a plan view and FIG. 12B is a front view;

FIG. 13A is a plan view and FIG. 13B is a front view;

FIG. 14A is a plan view and FIG. 14B is a front view in which a half portion showing a cross sectional view;

FIG. 17A is a plan view and FIG. 17B is a bottom plan view.

DESCRIPTION OF THE PREFERRED EMBODIMENT

Figure 1:
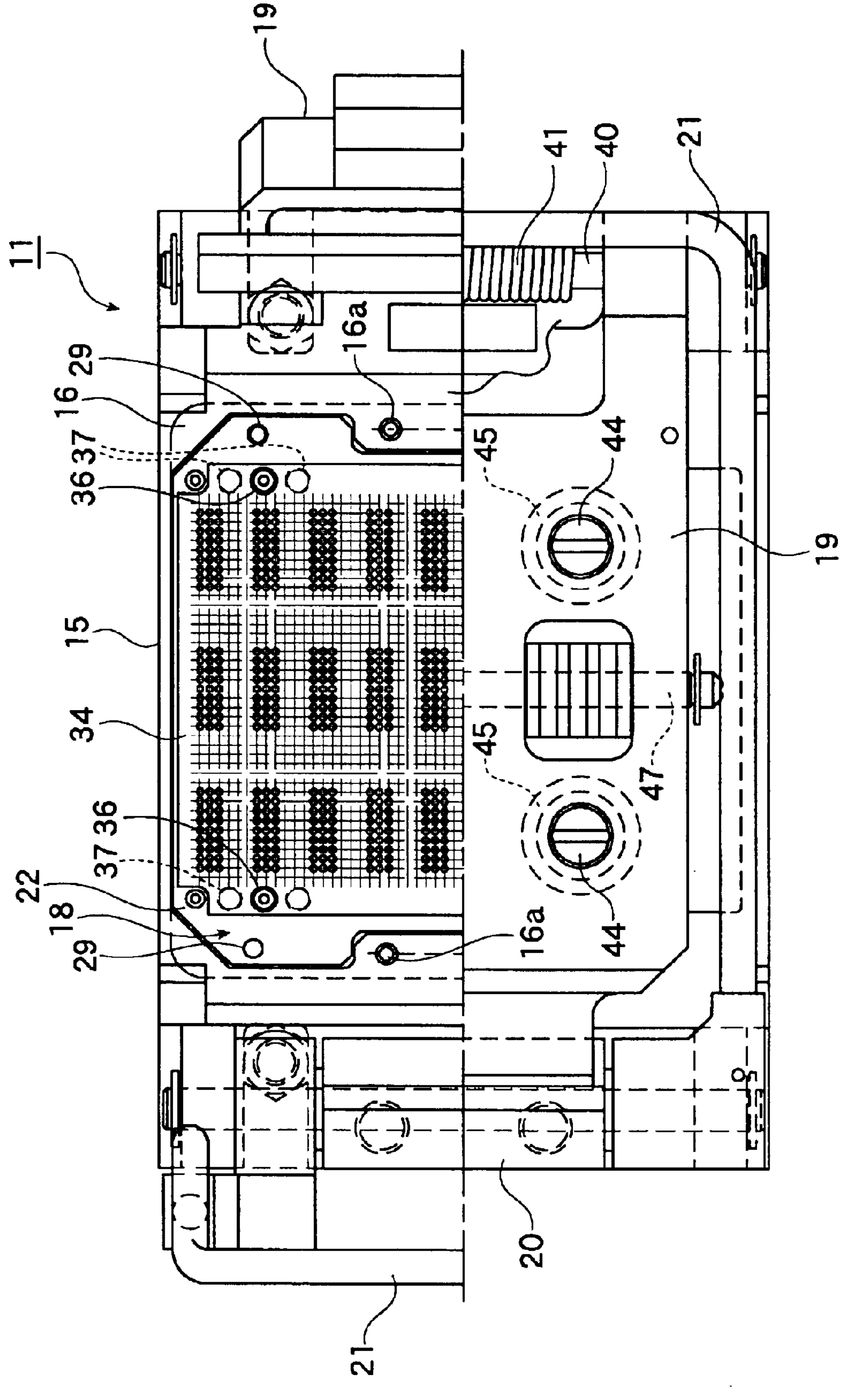
FIG. 1 is a plan view of an IC socket of the present invention, in which an upper half portion of the IC socket is opened whereas a lower half portion is closed.

A preferred embodiment of the present invention will be described hereunder with reference to the accompanying drawings.

In addition, it is to be noted that the terms "upper", "lower", "vertical", "horizontal" and the like described herein are used in the illustrated state or usable state of the socket or members associated herewith and also that a number of contact pins, holes and terminals are actually arranged, though the description may be made with reference to single one thereof for the sake of easy understanding of the present invention.

FIG. 1 to FIG. 17B show the embodiments of the present invention.

First, configuration of the socket will be explained. Reference numeral 11 is an IC socket as "socket for electrical parts." This IC socket is what is called a clam shell type and is used for conducting electrical performance test for IC package as "electrical part."

And this IC socket is used for connecting a terminal 12*b* of an IC package 12 and an electrode provided on a printed circuit board (electrical wiring board) 13 of IC test device (tester).

Figure 17A:
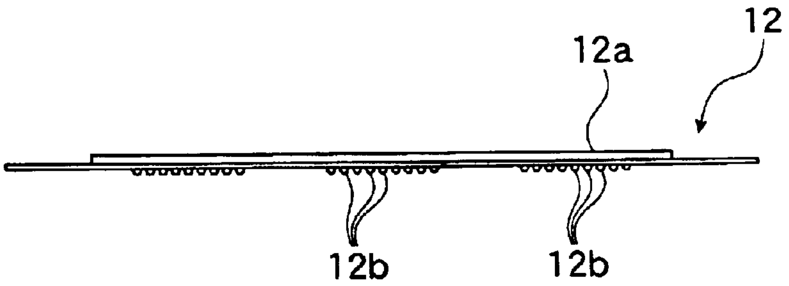
FIGS. 17A and 17B are views of the IC package of FIG. 1.
Figure 17B:
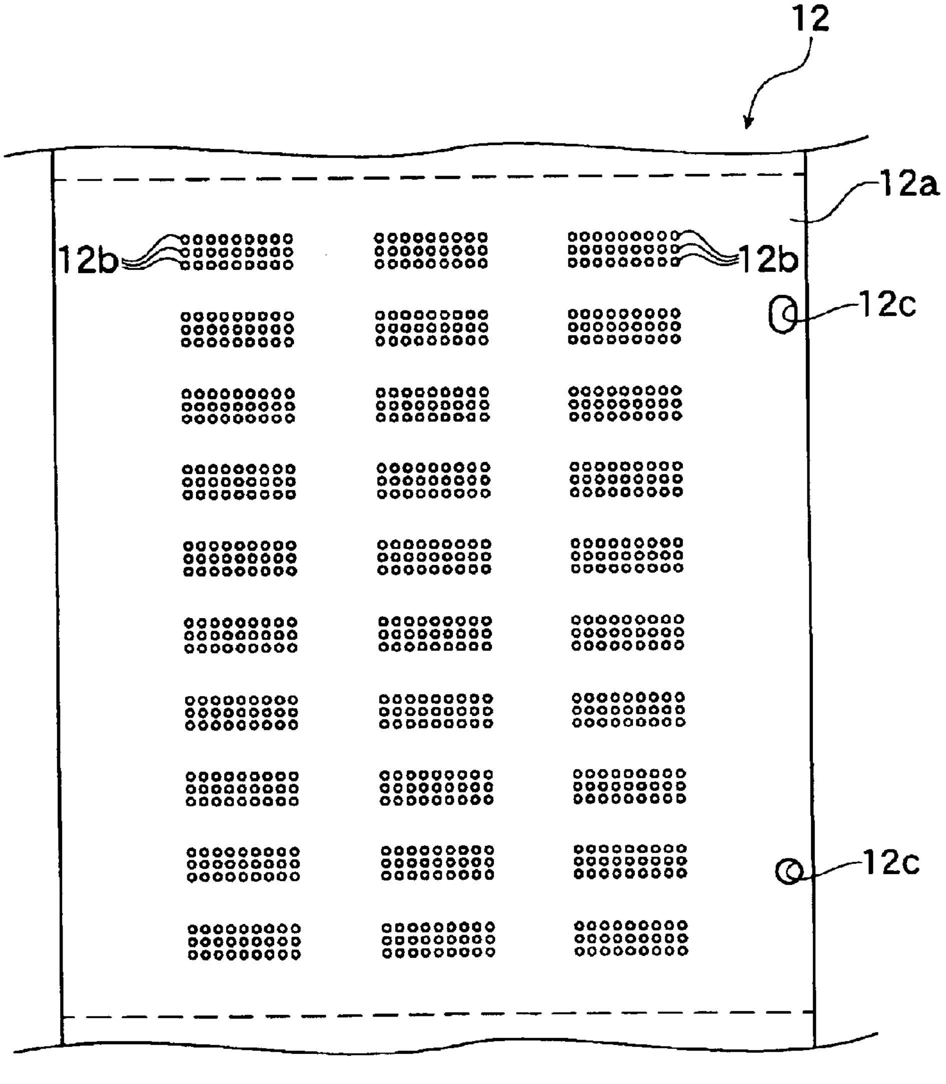
Figure 18:
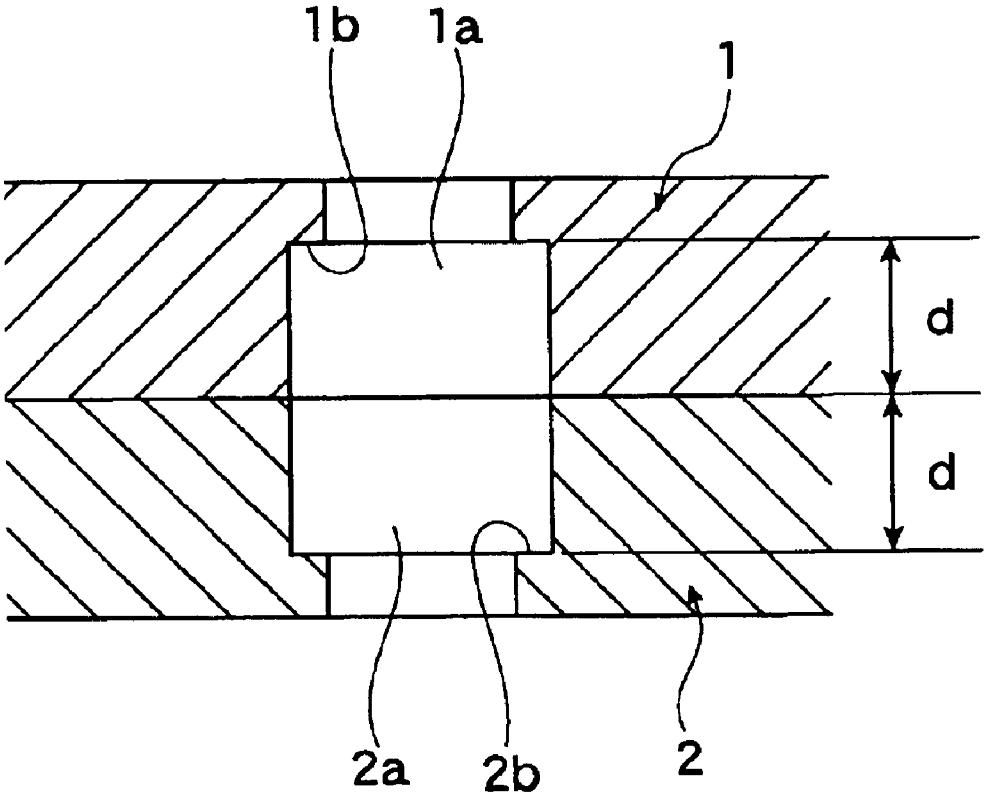
FIG. 18 is a cross sectional view of prior art.

The IC package 12, for example as shown in FIGS. 17A and 17B, has a plurality of terminals 12*b* arranged on a lower surface of a strip-like package body 12*a*.

Figure 2:
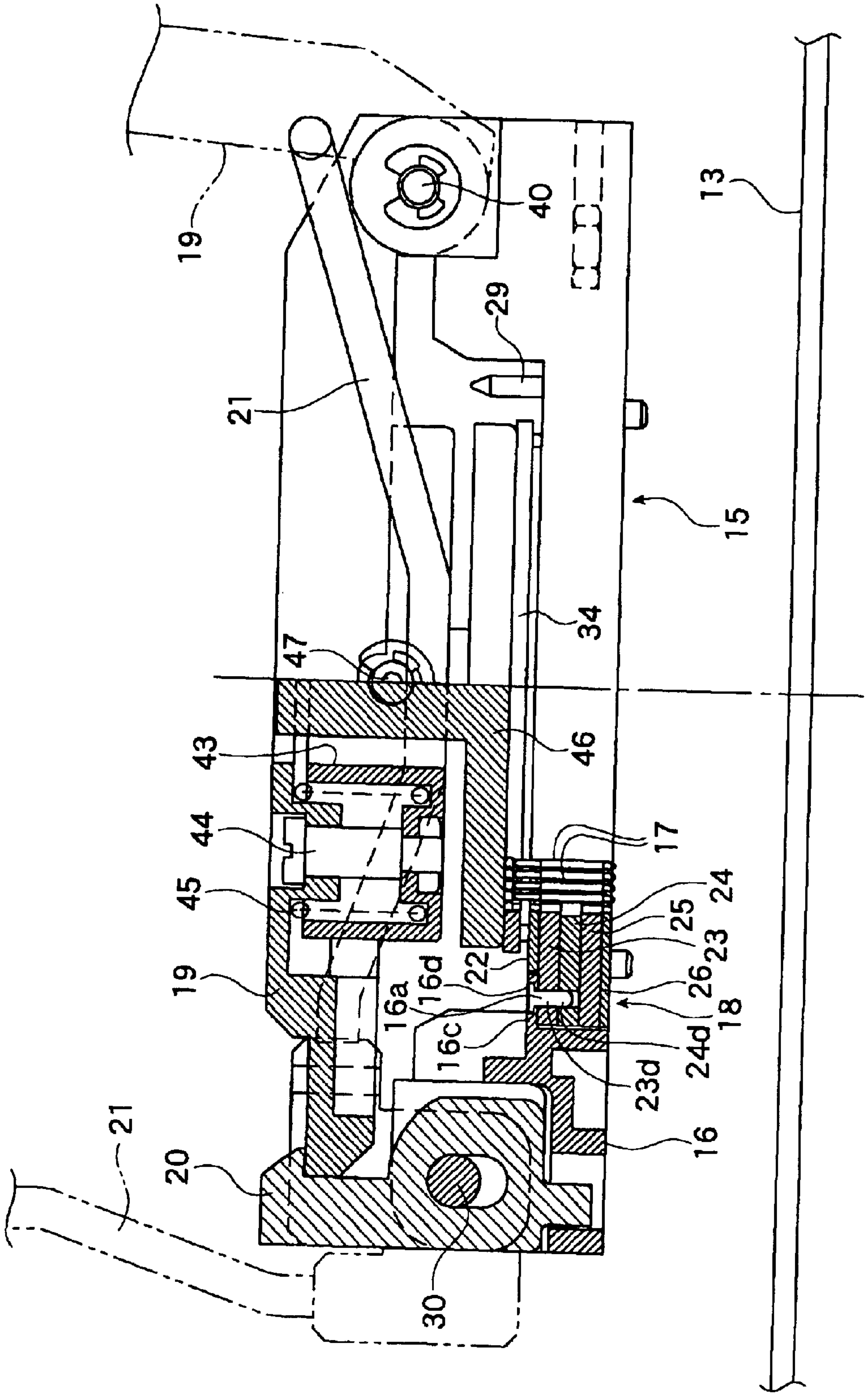
FIG. 2 is a front view of the IC socket of FIG. 1, a left portion showing a half cross sectional view.

In addition, the IC socket 11, as shown in FIG. 1 and FIG. 2, has a socket body 15 which is mounted on the printed circuit board 13. The socket body 15 has a socket frame 16 and a contact unit 18 to which a probe pin 17 as "contactor" is disposed. The socket body 15 also has a cover member 19, which is rotatably attached to the socket frame 16, for pressing the IC package 12.

A latch 20 for keeping the cover member 19 closed is provided to the socket body. An arm member 21 for locking the latch 20 is further provided to the socket body 15.

The contact unit 18, as shown in FIG. 4 to FIG. 7, has five electrically insulative synthetic resin plates (epoxy resin with glass fiber substrate)—a first plate 22, a second plate 23, a third plate 25, a fourth plate 26 and a spacer plate 24—. These plates and the spacer plate 22, 23, 25, 26, 24 accommodate a plurality of probe pins 17. These plates and the spacer plate 22, 23, 25, 26, 24 are made of epoxy resin with glass fiber substrate which is also used for the printed circuit board 13 so that both parts are designed to have almost the same thermal expansion coefficient.

Figure 7:
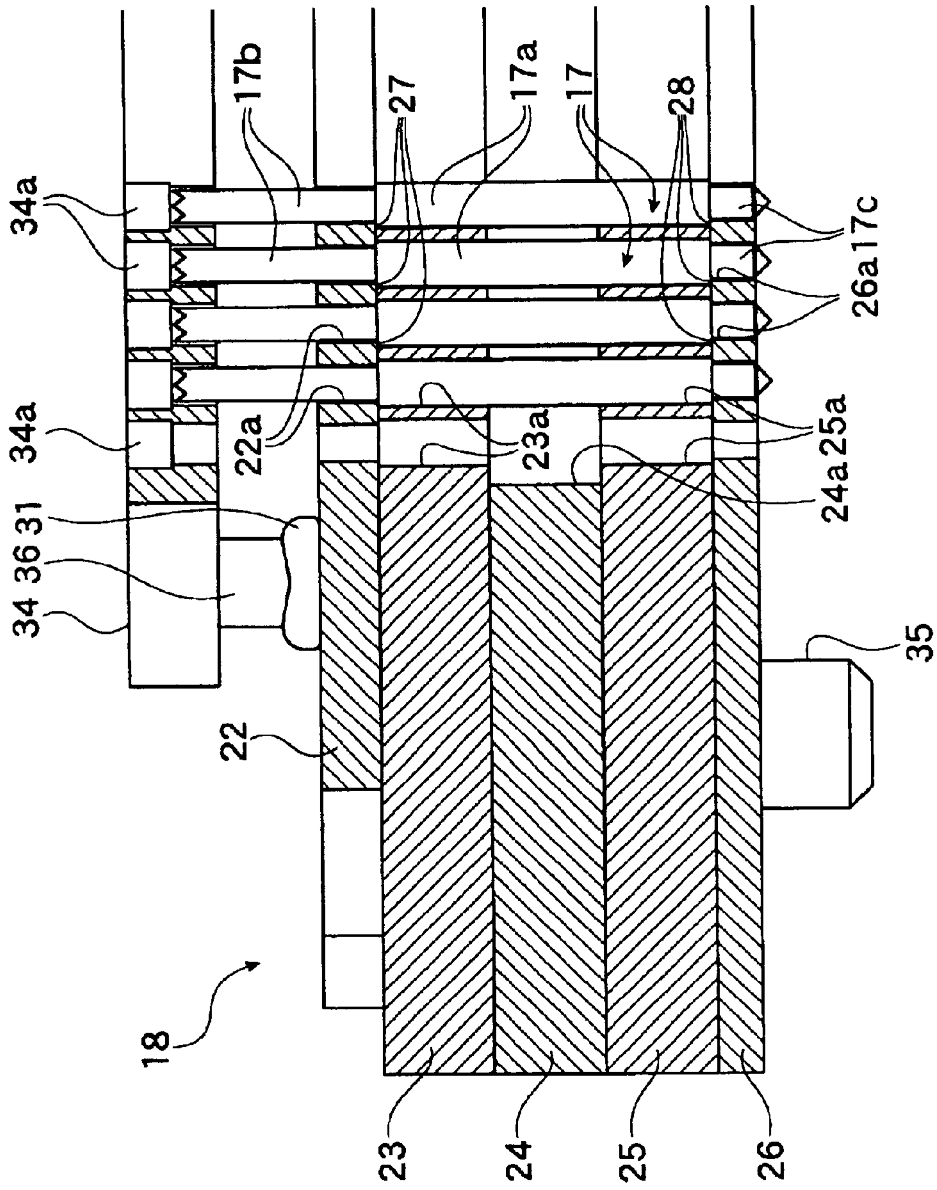
FIG. 7 is an enlarged cross sectional view of x portion of FIG. 5.
Figure 8:
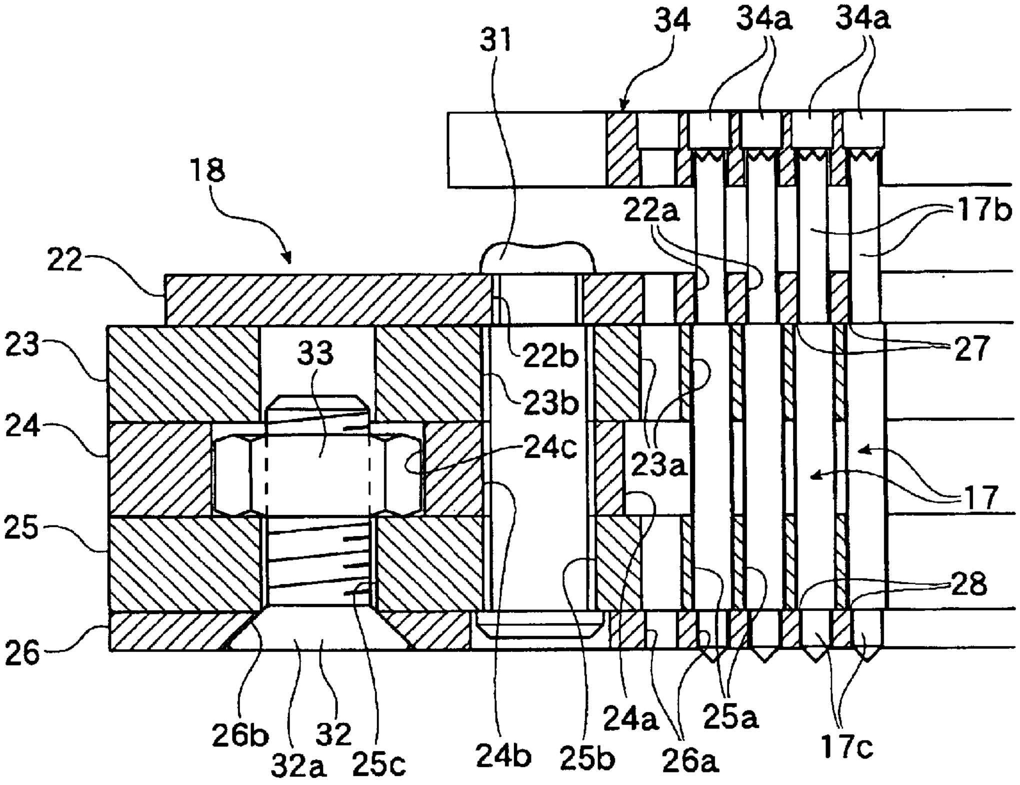
FIG. 8 is a cross sectional view showing an assembled state of each plate of the contact unit of FIG. 1.

The probe pin 17, as shown in FIG. 7 and FIG. 8, an upper contact member 17*b* and a lower contact member 17*c* are provided to be vertically moveable at an upper side and a lower side of a tubular body 17*a*, respectively. In the tubular body 17*a*, a spring (not shown) is disposed between both contact members 17*b*, 17*c* and urges both contact members 17*b*, 17*c* to push away from each other.

Further, plates and spacer plate 22, 23, 25, 26, 24, as an independent member, as shown in FIG. 10A~FIG. 14B, each has through holes 22*a*, 23*a*, 25*a*, 26*a*, 24*a* respectively, into which the probe pins 17 are arranged in concert with an arrangement of the spherical terminals 12*b* of the IC package 12. These through holes are formed by cutting process using, for example, drills.

Processing method to make the through hole is not limited to a cutting process using a drill. Various machine processing such as a laser processing or the like can be preferably used.

In the preferred embodiment of the present invention, the thickness of the first plate 22 is 0.8 mm; the second plate 23, the spacer plate 24 and the third plate 25 are 1.5 mm respectively; the fourth plate is 0.6 mm. These plates are made by exfoliating a copper wiring layer from the printed circuit board made of epoxy resin with glass fiber substrate, that is, in other words, formed from a plate made of a single material of epoxy resin with glass fiber substrate.

The hole size of the through hole 22*a* of the uppermost first plate 22 is made smaller than that of the through hole 23*a* of the second plate 23 that is positioned next to the uppermost plate. The hole size of the through hole 26*a* of the lowermost fourth plate is made smaller than that of the through hole 25*a* of the third plate 25 that is positioned next to lowermost plate.

Each of the through holes 22*a*, 26*a* of the uppermost first plate 22 and the lowermost fourth plate 26 has the hole size large enough for the upper contact member 17*b* or the lower contact member 17*c* of the probe pin 17 to pass through the through hole, respectively. But both hole sizes are smaller than the diameter of the tubular body 17*a* so that the tubular body 17*a* can not pass through both holes. The hole sizes of the through holes 23*a*, 25*a* of the intermediate second and third plates 23, 25 are made approximately the same outer diameter of the tubular body 17*a* of the probe pin 17.

Due to the difference in the hole size between the through hole 22*a* of the uppermost first plate 22 and the through hole 23*a* of the second plate 23, a step portion 27 is formed between these two holes. In the same manner, due to the difference in the hole size between the through hole 26*a* of the lowermost fourth plate 26 and the through hole 25*a* of the third plate 25, a step portion 28 is formed between these two holes.

An upper and lower end of the tubular body 17*a* of the probe pin 17 engage with these step portions 27, 28 so that the probe pin 17 can be prevented from coming off upward and downward.

In addition, the spacer 24 disposed between the second and third plates 23, 25, has a frame-like shape, and an inner side opening portion of the frame-like shape is the through hole 24*a* through which a plurality of the arranged probe pins 17, which corresponds to the terminals 12*b* of the IC package 12, can pass.

As shown in FIG. 8, in the upper side 4 sheets—the first, the second, the third plates and the spacer plate 22, 23, 25 and 24—, through hole 22*b*, 23*b*, 25*b* and 24*b* is formed, respectively. A rivet is inserted into these holes and caulked so that these plates and spacer are united in a laminated manner.

At this state prior to mounting of the fourth plate 26, the probe pin 17 can be inserted into and drawn out from the lower side of the through hole 25*a* of the third plate 25.

Further, as shown in FIG. 8, bolt holes 25*c*, 26*c* are formed in the third plate 25 which is mounted on the lowermost plate and in the lowermost fourth plate 26. A bolt 32 is inserted into these bolt holes 25*c*, 26*c* and then is screwed into a nut 33, to fix up these two plates together.

The bolt 32 has a dish-like head portion 32*a*. The head portion 32*a* is inserted into the bolt hole 26*b* of the fifth plate 26 and the bolt 32 screws up together with the nut 33 which is provided in a hole 24*c* of the spacer plate 24.

According to the structure mentioned above, the five sheets of the first, second, third, fourth plates and the spacer 22, 23, 25, 26, 24 are built up all together in a laminated manner.

Figure 5:
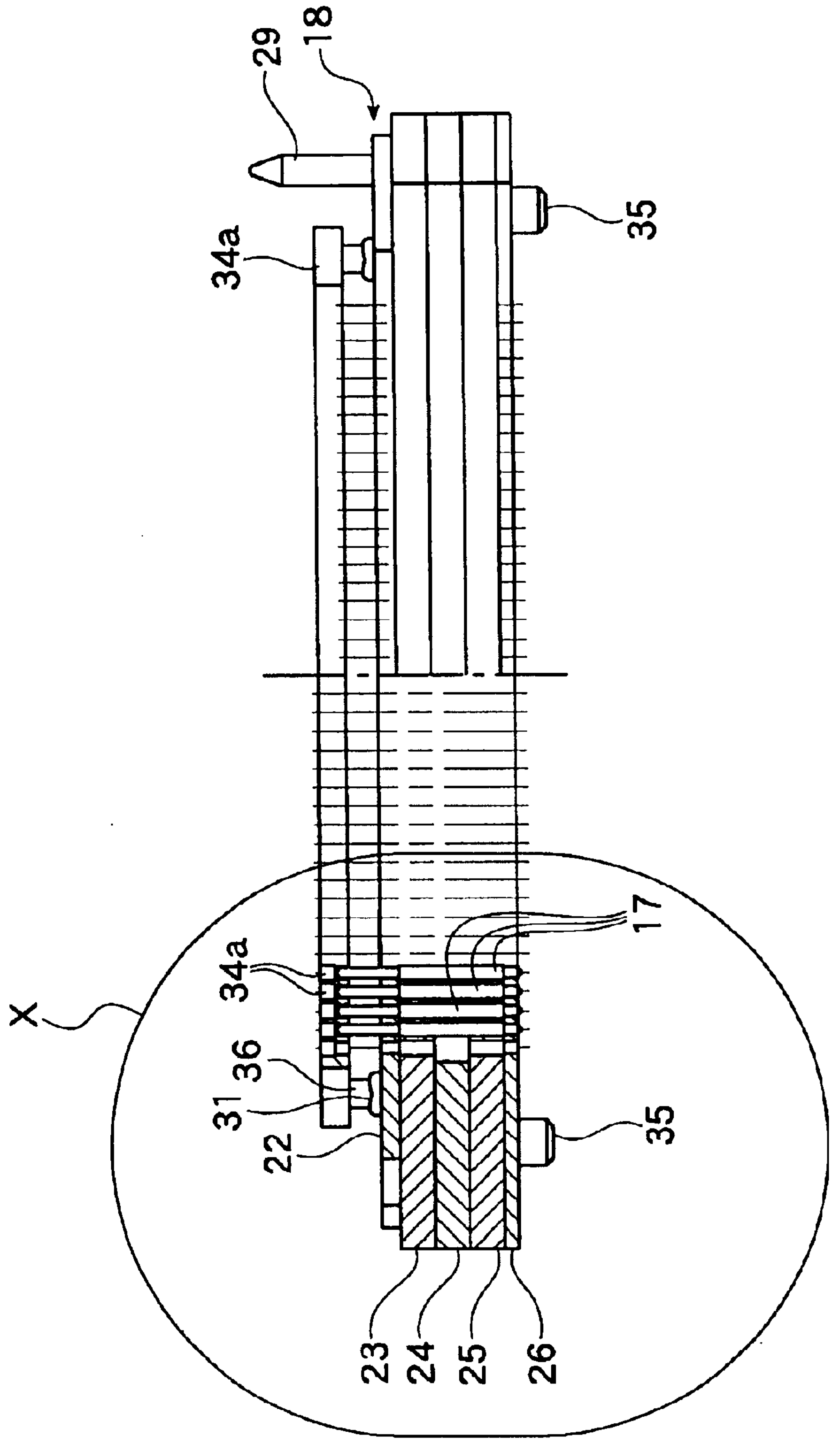
FIG. 5 is a cross sectional view taken along the line v—v of FIG. 4.
Figure 6:
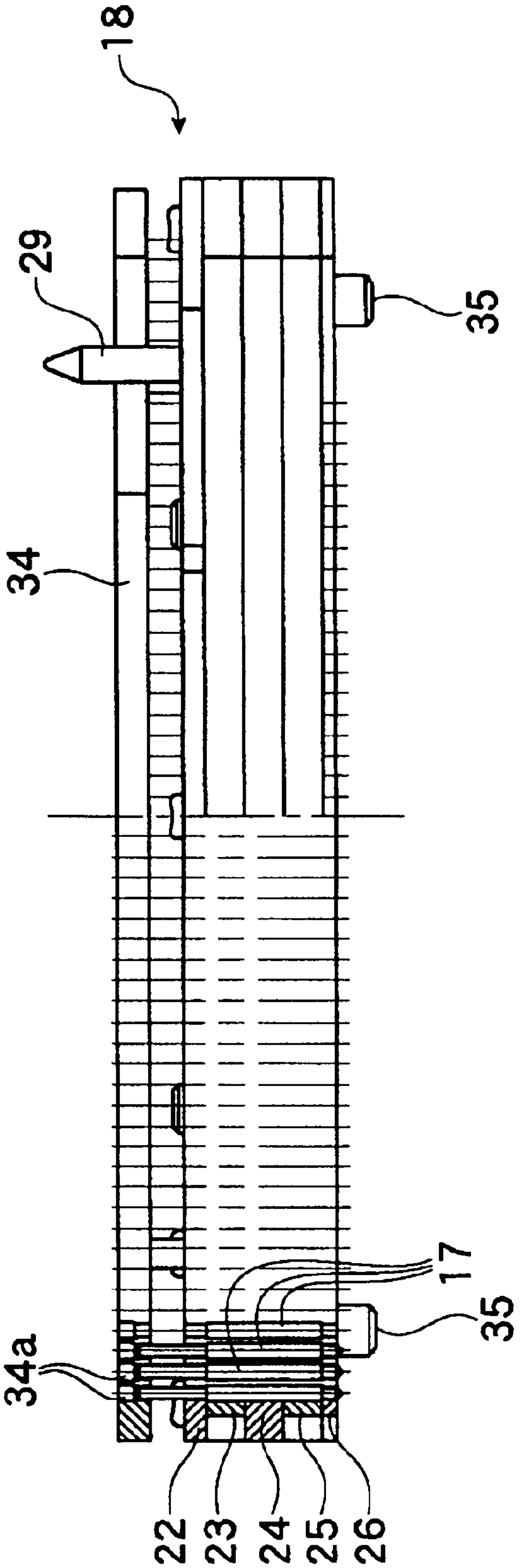
FIG. 6 is a right side view of FIG. 4, a left portion showing a half cross sectional view.

Further, as shown in FIG. 5 and FIG. 6, a positioning pin 29 is projected upward from the first plate 22. The positioning pin 29 is inserted into a positioning hole 12*c* of the IC package 12, to position the terminal 12*b* of the IC package 12 and the probe pin 17.

Furthermore, from the under side of the contact unit 18, as shown in FIG. 5 and FIG. 6, a plurality of fitting pins (positioning portions) 35 are protruded. These fitting pins 35 are fitted into a fitting hole (not shown) of the printed circuit board 13 so that the probe pin 17 of the contact unit 18 is adjusted to be positioned on the electrode of the printed circuit board.

Figure 4:
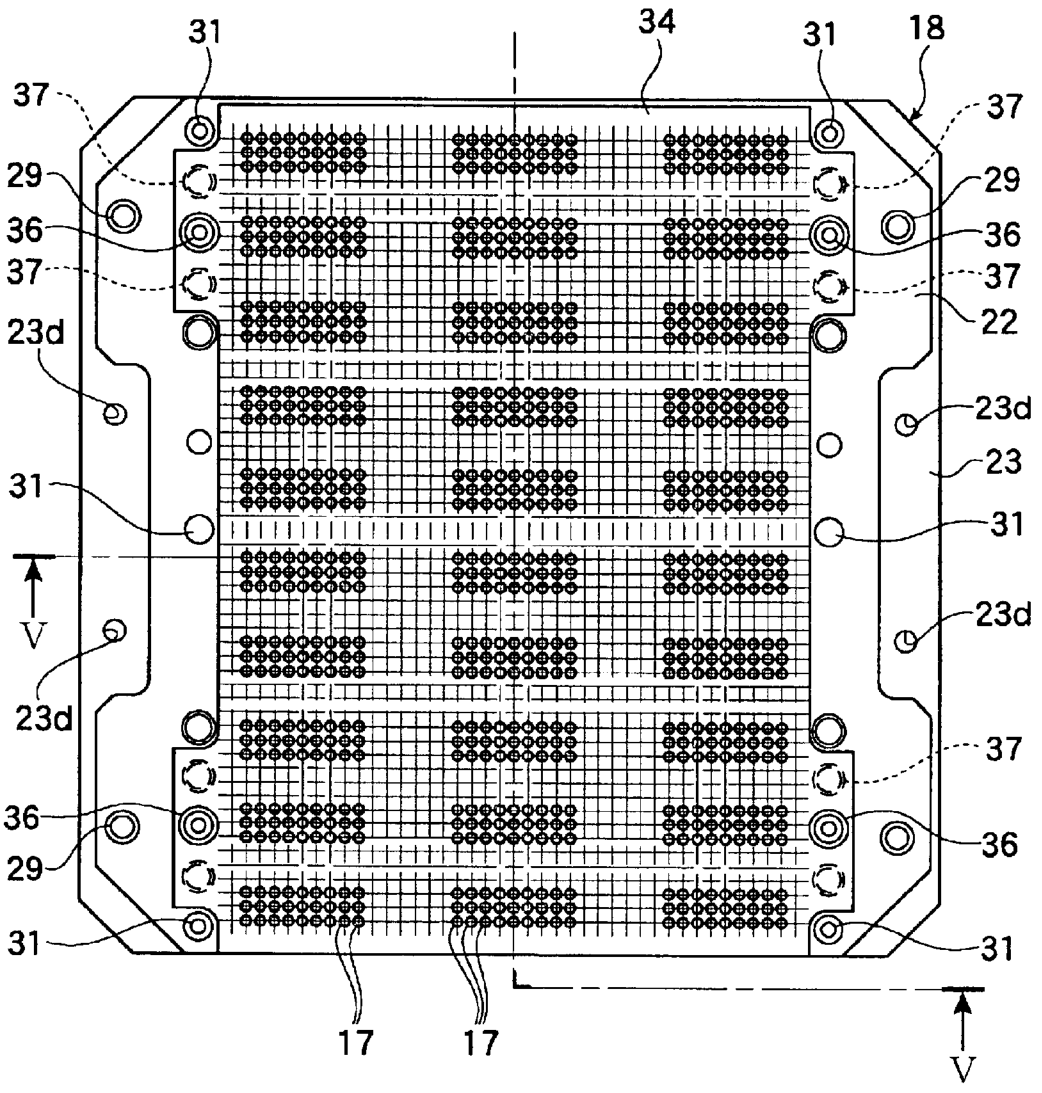
FIG. 4 is a plan view of a contact unit of FIG. 1.
Figure 9:
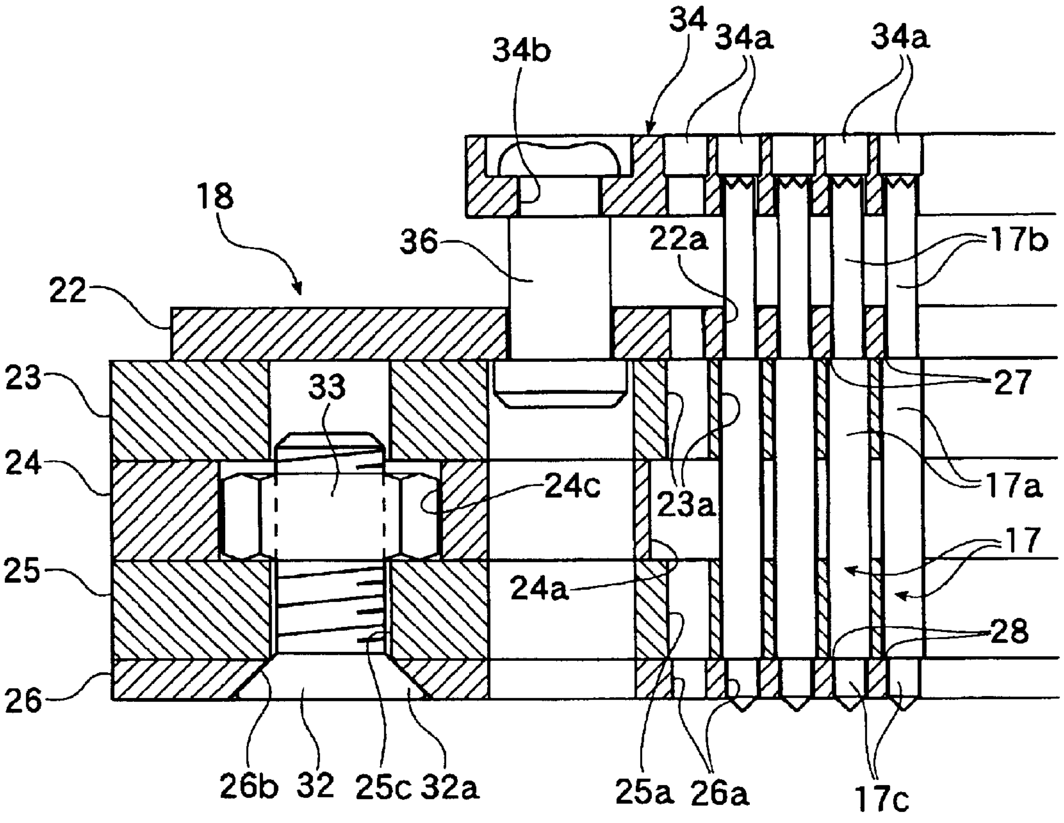
FIG. 9 is a cross sectional view showing an assembled state of a floating plate of FIG. 1.
Figure 10A:
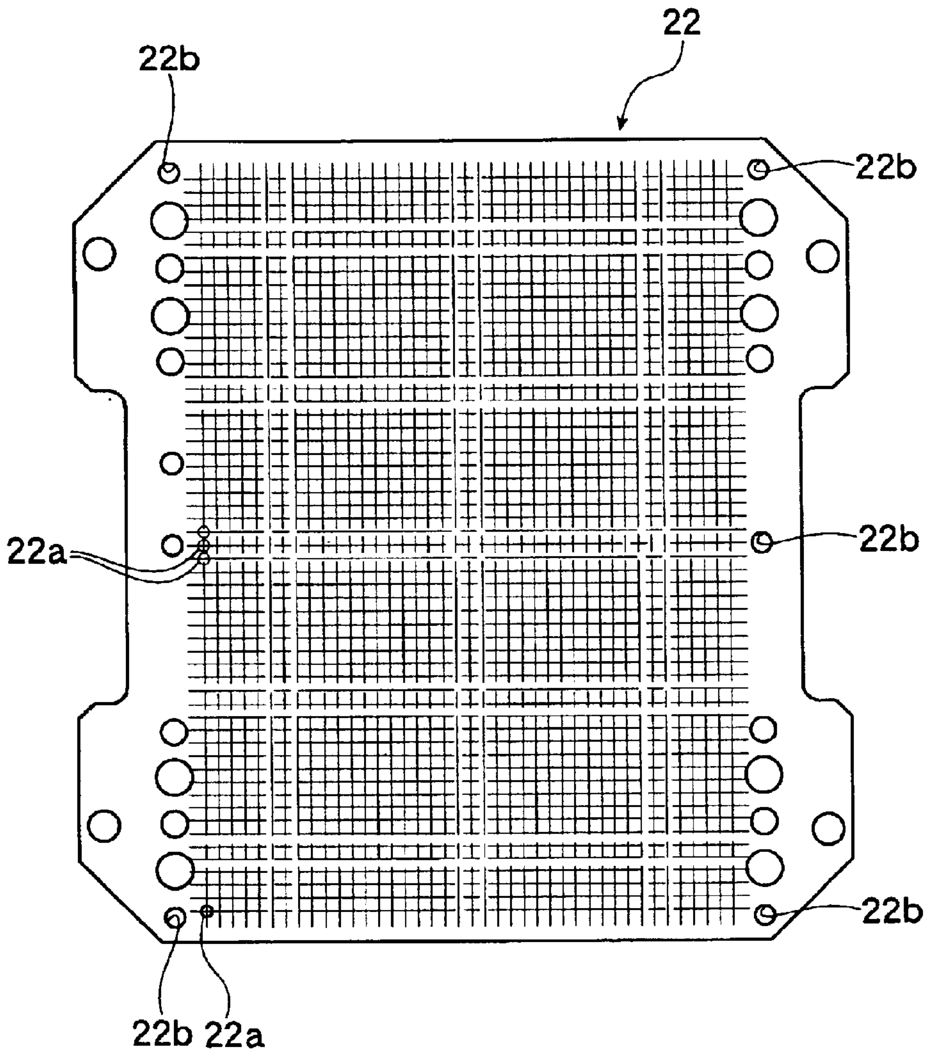
FIGS. 10A and 10B are views showing a first plate of FIG. 1.
Figure 10B:
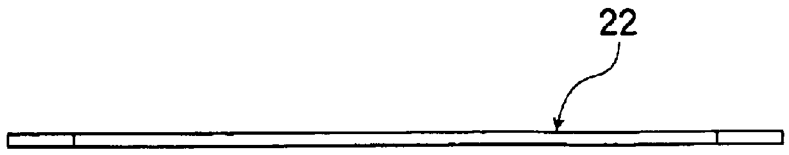
Figure 11A:
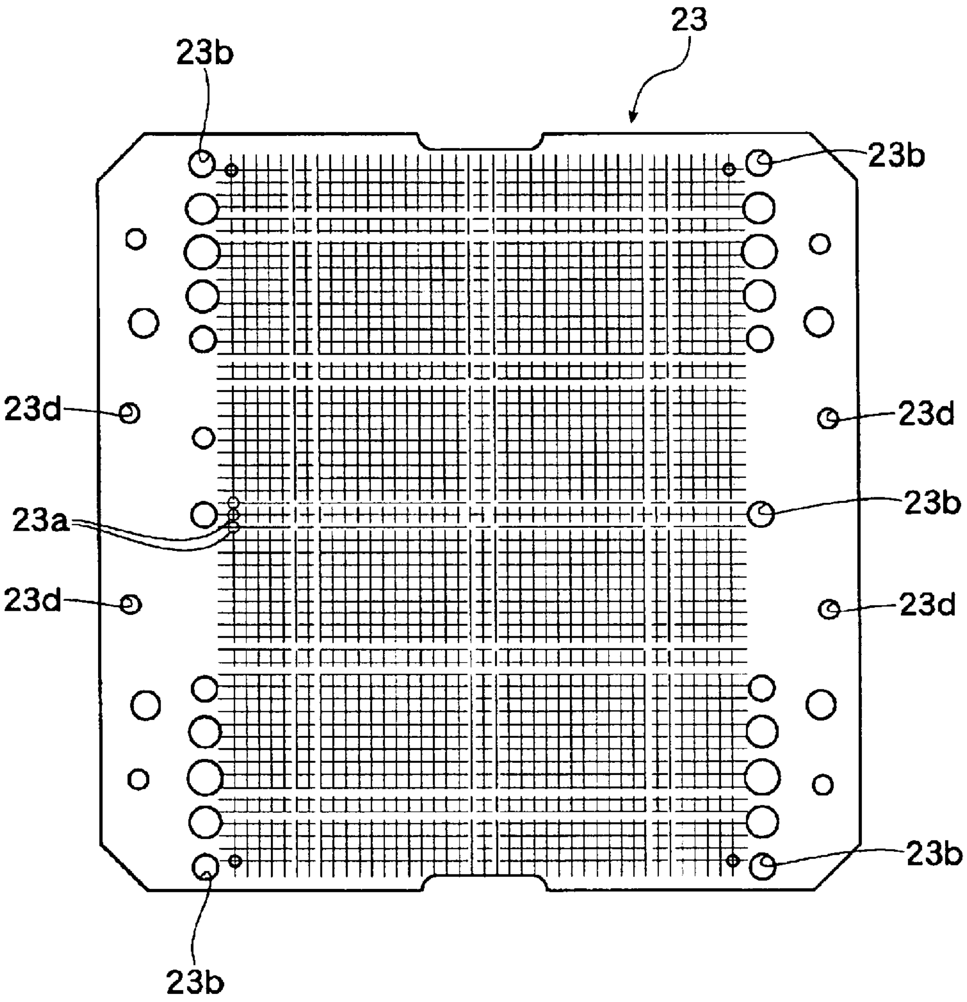
FIGS. 11A and 11B are views showing a second plate of FIG. 1.
Figure 11B:
Figure 12A:
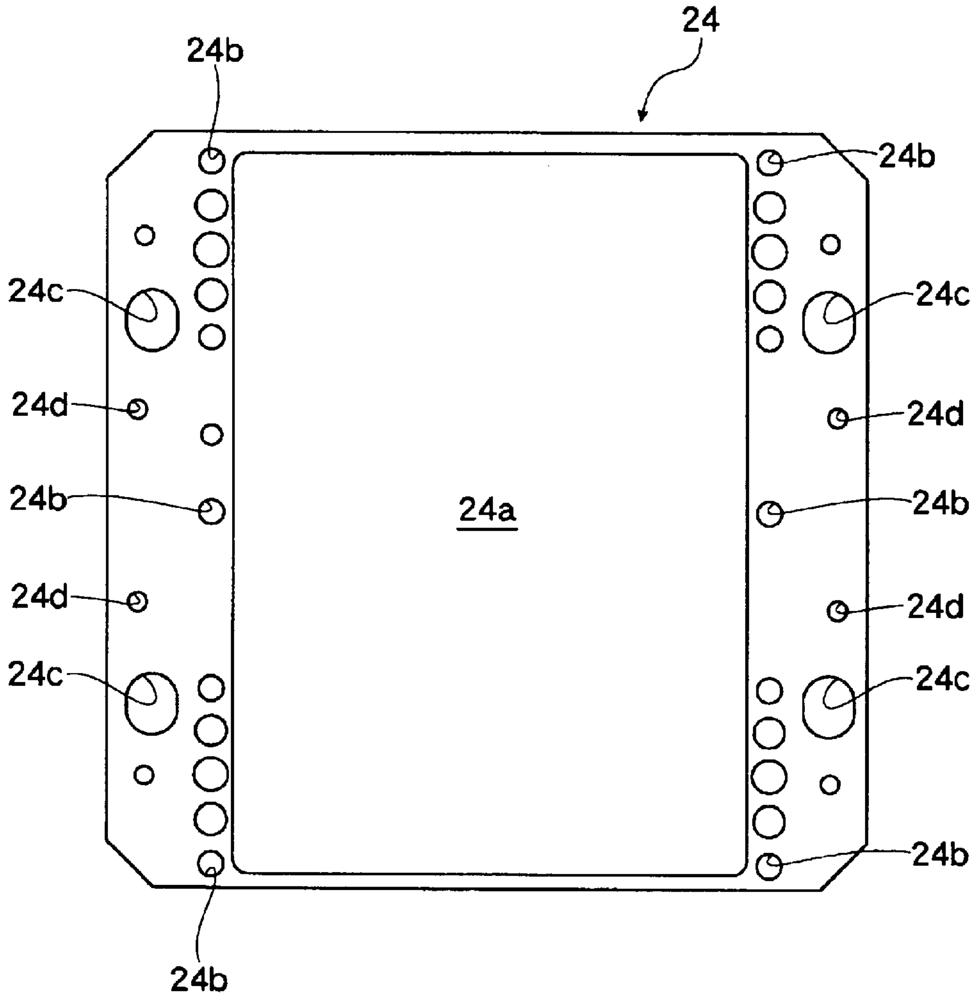
FIGS. 12A and 12B are views of spacer plate of FIG. 1.
Figure 12B:
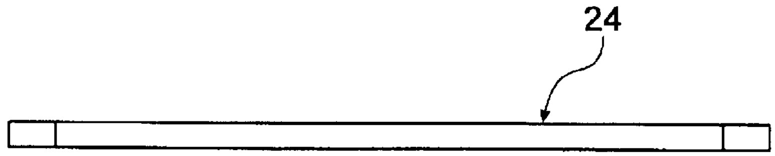
Figure 13A:
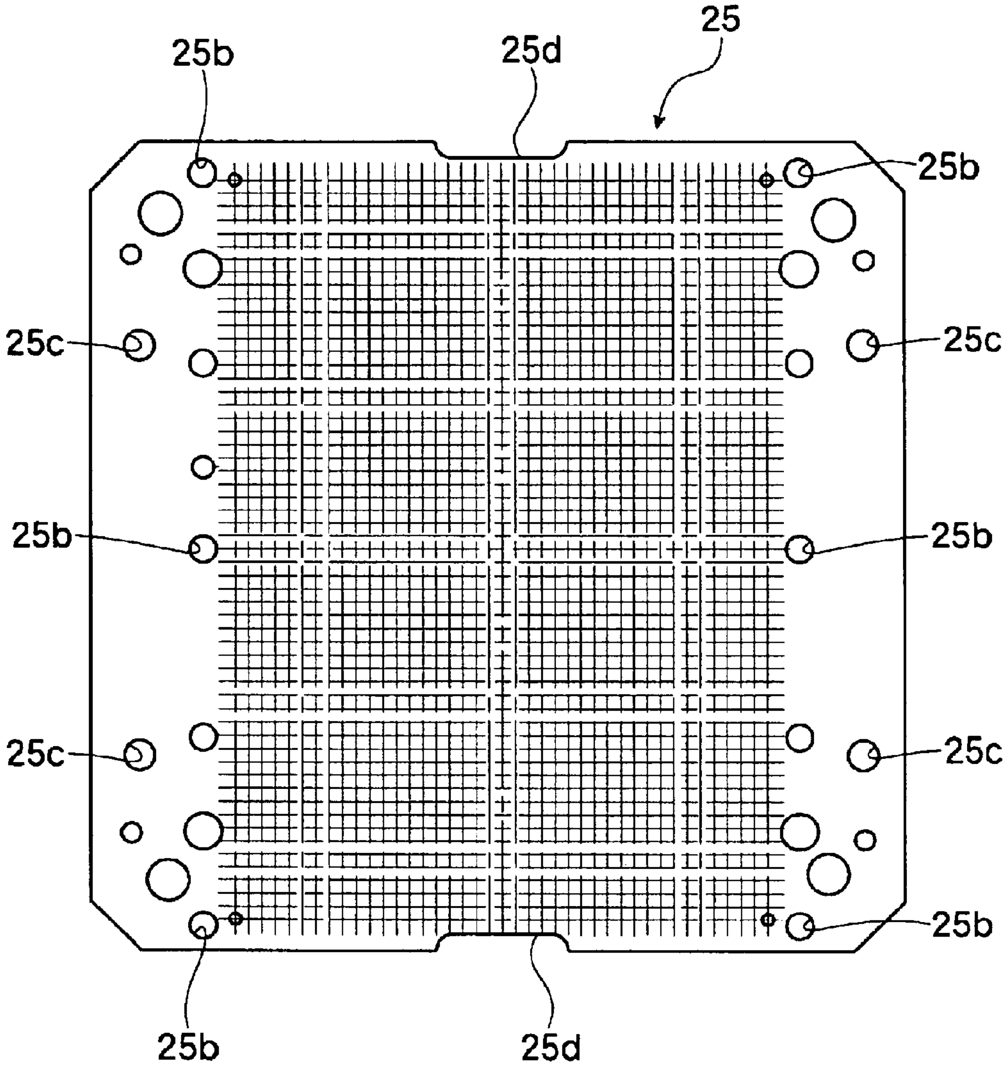
FIGS. 13A and 13B are views of a third plate of FIG. 1.
Figure 13B:
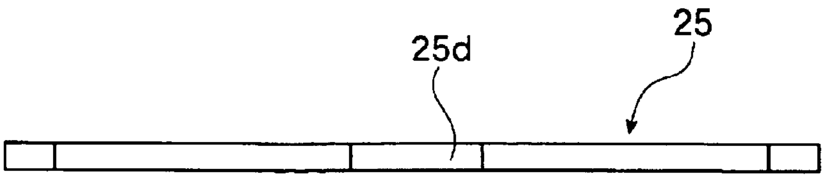
Figure 14A:
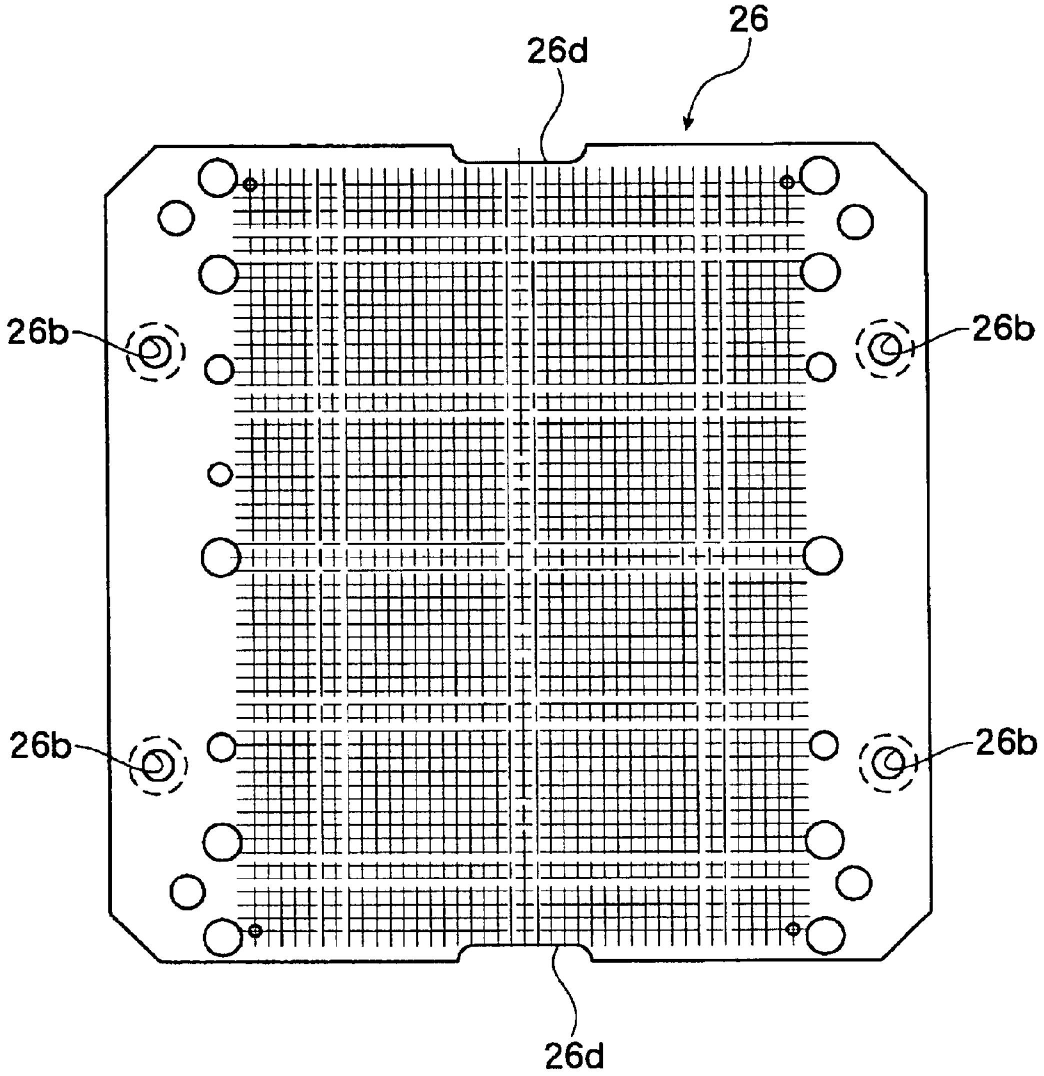
FIGS. 14A and 14B are views of a fourth plate of FIG. 1.
Figure 14B:
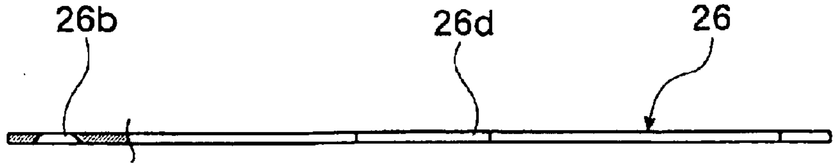
Figure 15:
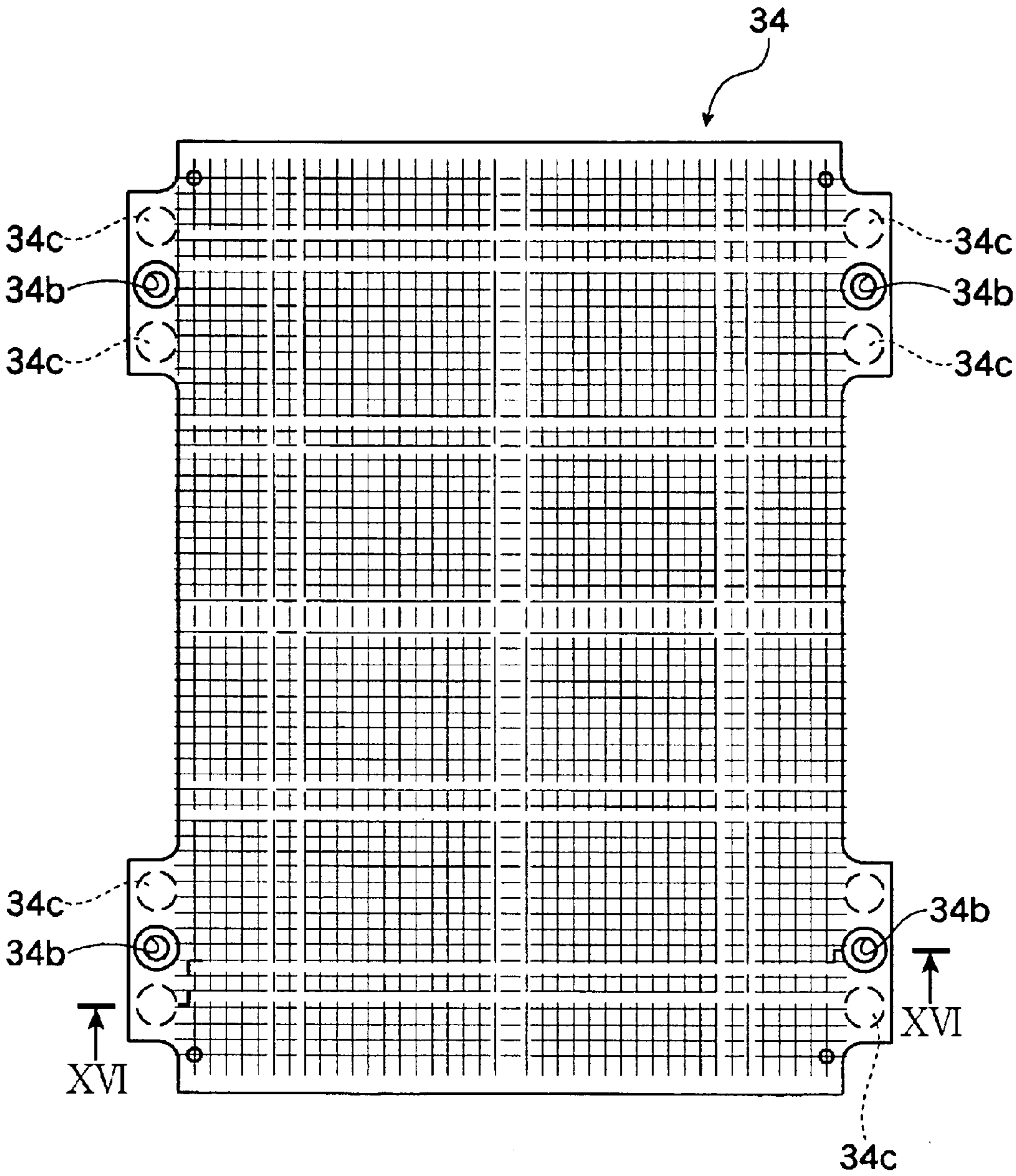
FIG. 15 is a plan view of the floating plate.
Figure 16:
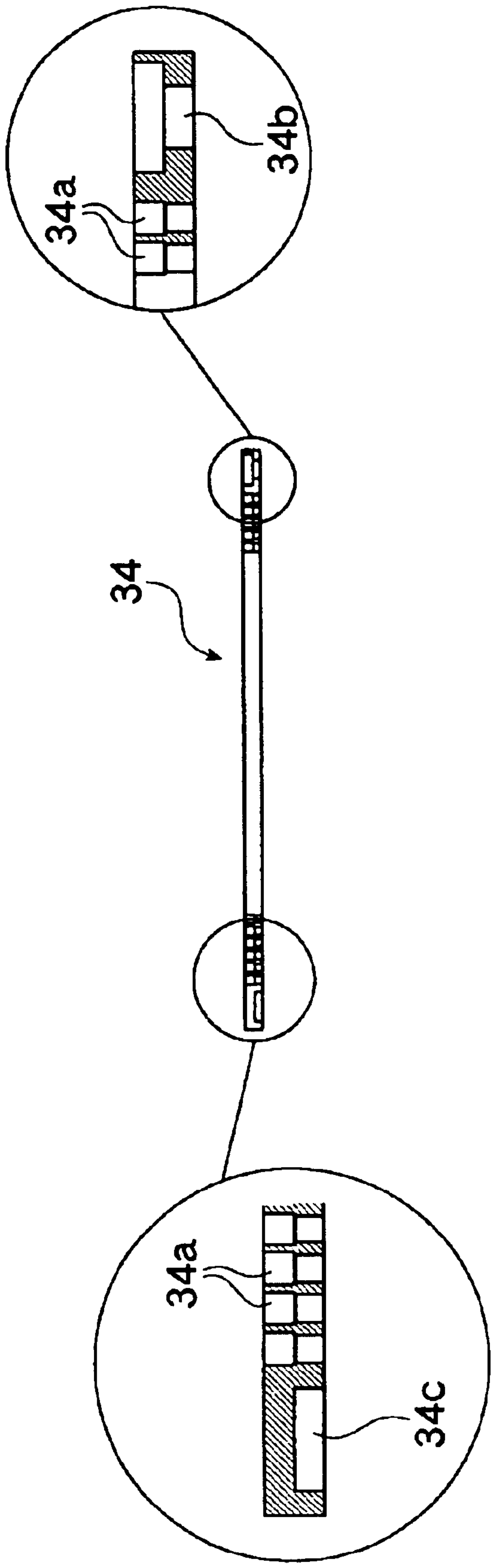
FIG. 16 is a cross sectional view taken along XVI—XVI line of FIG. 15.

Further, on the upper side of the first plate 22, as shown in FIG. 8, a floating plate 34 is disposed to be vertically moveable. On the upper side of the floating plate, the IC package 12 is designed to be accommodated. In other words, the floating plate 34, as shown in FIG. 9, is disposed to be vertically moveable, with respect to the contact unit 18, by a rivets for the floating plate 36 provided in a rivets hole 34*b*. And as shown in FIG. 4, a spring 37, which is disposed on both side portions of the rivets for the floating plate 36, urges the floating plate 34 upward. An upper portion of the spring 37 is inserted into a recess for the spring 34*c* of the floating plate 34. (see FIG. 16)

Furthermore, to the floating plate 34, as shown in FIG. 7 to FIG. 9, an insertion hole 34*a*, into which the upper contact member 17*b* of the probe pin 17 is inserted, is formed. And the terminal 12*b* of the IC package 12 is inserted into the insertion hole from above.

The contact unit 18 is detachably attached to an inner side of a frame-like socket frame 16 by inserting the unit 18 into the inner side of the socket frame 16. More specifically, as shown in FIG. 2, a collar portion 16*c* is formed to the socket frame so that the collar portion 16*c* protrudes toward inner side from a peripheral portion of the opening portion. An upper surface of the second plate 23 of the contact unit 18 abuts against a lower surface of the collar portion 16*c*. An alignment pin 16*a* is designed to be fixed from above into a fitting hole 16*d* of the collar portion 16*c*, fitting holes 23*d*, 24*d* of the second plate 23 and the spacer plate 24.

Figure 3:
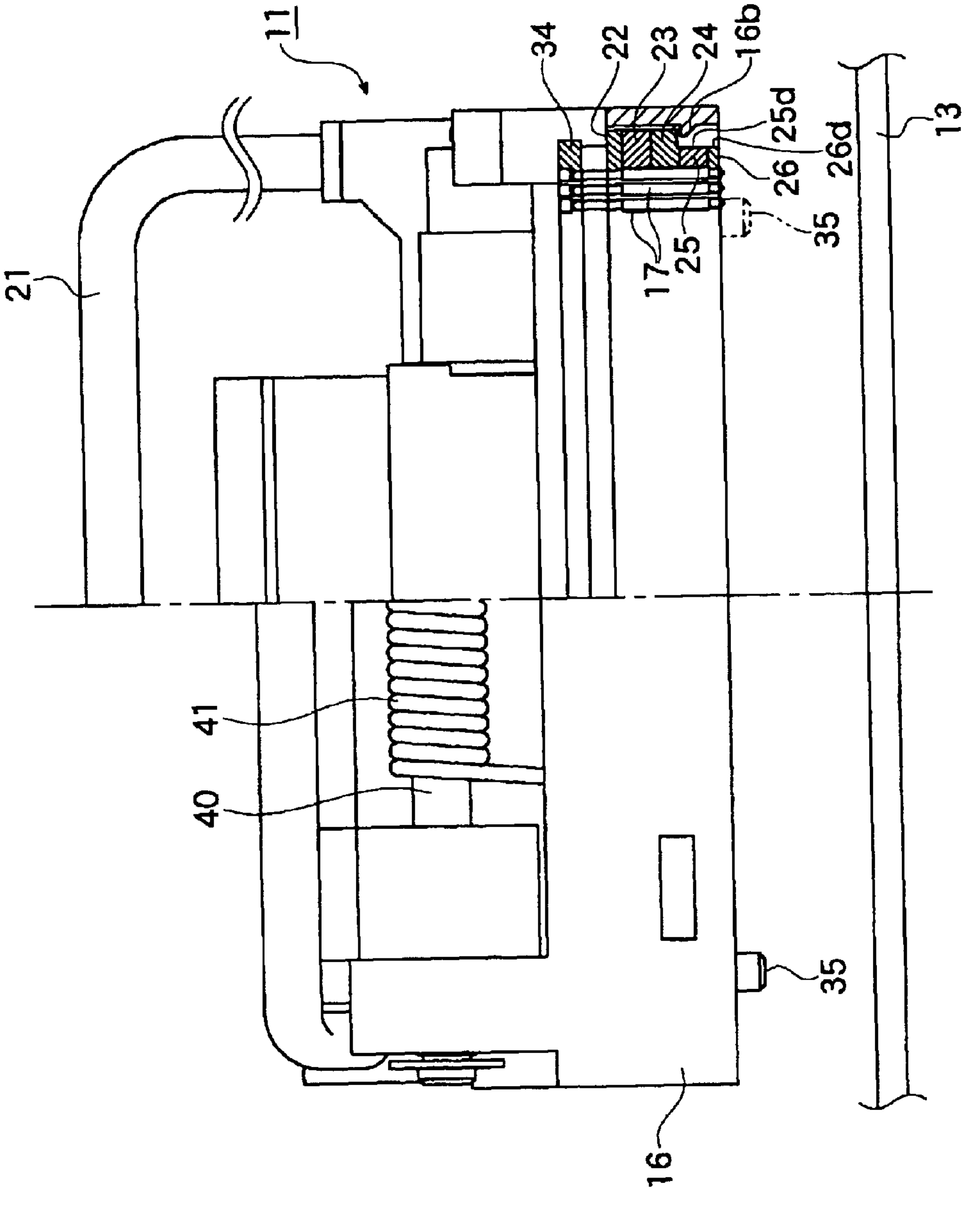
FIG. 3 is a right side view of FIG. 1.

As shown in FIG. 3, an engaging claw 16*b* is formed on the socket frame 16. The engaging claw 16*b* is designed to be engaged with a lower surface of the spacer plate 24 of the contact unit 18. And a recess portion 25*d*, 26*d* for the engaging claw 16*b* is formed on the third and fourth plate 25, 26. The socket frame 16 can be disengaged from the contact unit 18 by unlatching the engaging claw 16*b*.

Positioning of x and y directions in the horizontal level of the socket frame 16 and the contact unit 18 is carried out by the alignment pin 16*a*. Positioning of z direction is carried out by superimposing the lower surface of the collar portion 16*c* of the socket frame 16 on the upper surface of the second plate 23 of the contact unit 18.

On the other hand, as shown in FIG. 2, the cover member 19 is rotatably attached to the socket frame 16 by a rotating axis 40. And as shown in FIG. 1, the cover member 19 is urged in its opening direction by a spring 41.

As shown in FIG. 2, a pressing member 43 is disposed to be vertically slidable to the cover member 19 through a guide pin 44. The pressing member 43 is designed to be urged downward in FIG. 2 with respect to the cover member 19 by spring 45. A pressing pad 46 is rotatably attached to the pressing member 43 through an axis 47.

In addition, a latch 20 is rotatably provided on the socket frame 16 through a shaft 30, to engage and disengage with an end edge portion of the cover member 19. The latch 20 is designed to be moved vertically and rotatably, by a structure not shown, by rotating an arm member 21 around the center of the shaft 30. More specifically, under the state that the arm member 21 is standing straight as shown by the double dashed chain lines in FIG. 2, the cover member 19 is closed and then the latch 20 is brought to an engaging condition with the end edge portion of the cover member 19. At this stage, the cover member 19 is not yet completely closed and the IC package is also not yet pressed by the pressing pad 46. Then the standing arm member 21 is pushed down clockwise as shown by a solid line in FIG. 2 to an approximately horizontal position. The cover member 19 is designed to be further rotated downward as the latch 20 is pushed downward by the rotation of the cum portion (not shown) which is rotated by the arm member 21. With these operation, the cover member 19 is completely closed and the IC package 12 is designed to be pressed by the pressing pad 46.

As described above, in the socket for electrical parts 11 of the embodiment of the present invention, the stepped portion 27 and 28 of the contact unit are formed by superimposing the first plate 22 on the second plate 23, and the third plate 25 on the fourth plate 26, respectively. Therefore, there is no need to form a stepped hole in one plate, as is conventionally used to.

Thanks to the aforementioned structure, dispersion (difference) of the hole's depth (or height) of the larger diameter portion of the stepped hole, which has been a problem in forming the stepped hole in one plate by machine work, can be eliminated and all one need to do is to control the thickness of the second plate 23 and the third plate 25.

In addition, the hole size of all through holes in each first to fourth plates 22, 23, 25, 26 has the same diameter, respectively. When compared to the conventional plate in which holes having a stepped portion (2kinds of holes in one plate) are formed in one plate, shape and pitch of holes of the present invention can be formed in less time and accurately, being able to bring down production costs.

Further, the first to fourth plates 22, 23, 25, 26 are formed from a board material commercially sold as a standard product so that the size (thickness) is controlled within a prescribed range. A board being suitable for machine work and having a desired thickness can be arbitrarily selected and can be obtained at a reasonable price.

Between the second plate 23 and the third plate 25, the spacer plate 24 is interposed. The probe pin 17 having a different length can be accommodated into the contact unit 18 by only replacing the spacer 24 with another spacer having different thickness, without replacing the first to fourth plates 22, 23, 25, 26 having different thickness. In other words, a variety of probe pins having different length can be suitably accommodated into the contact unit 18 with the stepped portion's (27, 28) dimensional accuracy maintained.

In addition, the dimensional accuracy of the through hole 24*a* of the space plate 24 is not so strictly required as that of the through holes of other plates, so far as a plurality of probe pins 17 can be passed through the through hole 24*a*.

Further, the contact unit 18 and the socket frame 16 can easily be attached to and detached from each other by only engaging and disengaging with the engaging claw 16*b*, being able to replace them. Replacement of the probe pin can be easily carried out by removing the contact unit 18 from the socket frame 16 and then taking out the bolt 32 and the fourth plate 26.

As the contact unit 18 is mounted on the printed circuit board 13 through a fitting pin 35 and as the socket frame 16 is attached on the basis of the position of the contact unit 18, the contact unit 18 can be positioned more precisely on a specific position of the printed circuit board when compared with a socket in which the contact unit 18 is attached to the printed circuit board 13 on the basis of the socket frame 16. In other words, attaching the socket frame 16 to the contact unit 18 is less disadvantageous in attaching the contact unit 18 and the socket frame 16 than directly attaching the socket frame 16 to the printed circuit board 13, because the socket frame 16 is used for supporting the cover member 19 or the like which press the IC package 12 so that positioning accuracy of the socket frame with respect to the printed circuit board 13 is not so strictly required.

By the way, when the contact unit 18 and the socket frame 16 are both designed to be attached to the printed circuit board 13, difficulties may be happened in attaching them if there is a molding error in each portion.

Further, each plates 22~26 is made of the same material (epoxy resin with glass fiber substrate) as that of the printed circuit board 13 so as to make the thermal expansion coefficient of both plates 22~26 and the printed circuit board 13 approximately the same coefficient. Therefore, positional relationship between the probe pins 17 held by the contact unit 18 and the electrodes of the printed circuit board 13 can be kept constant even when both parts are expanded by heat when they are placed in a high temperature circumstance.

Assembling of such contact unit 18 and socket frame 16 is designed to be carried out by making the engaging claw 16*b* of the socket frame 16 engage with a lower surface of the third plate 24 of the contact unit 18 and then inserting the alignment pin 16*a* into both attaching holes 16*d* of the socket frame 16 and attaching holes 23*d*, 24*d* of the contact unit 18.

Next, operation of the socket will be explained hereunder.

Accommodating the IC package 12 can be carried out by previously attaching the IC socket 11 to the printed circuit board 13, opening the cover member 19, accommodating the IC package 12 on a floating plate 34, and then inserting a positioning pin 29 of the side of the contact unit 18 into a positioning hole 12*c* of the IC package 12.

From the state mentioned above, the cover member 19 is closed and the latch 20 is engaged with the cover member 19. Then the arm member 21 is rotated downward as shown by the solid lines in FIG. 2 and the cover member 19 is further rotated in a closing direction of the cover member 19, and then the cover member 19 is kept closed.

Under this state, the IC package 12 is pressed by the pressing pad 46 and the floating plate 34 is moved downward against the urging force of the spring 37, and then the terminal 12*b* of the IC package 12 is contacted with the upper contact member 17*b* of the probe pin 17. Following the above mentioned operation, the IC package 12 is further pressed downward to move the terminal 12*b* downward so that the upper contact member 17*b* is moved downward against the urging force of the spring built in the tubular body 17*a*, and finally the upper contact member 17*b* and the IC package 12*b* is contacted by a prescribed pressure. At this time the lower contact member 17*c* is also contacted with the printed circuit board 13 by a prescribed pressure.

At this state the IC package's terminal 12*b* is electrically connected with the printed circuit board 13 through the probe pin 17, then the burn-in testing etc. of the IC package 12 are conducted.

Removing the IC package 12 from the socket after the testing can be done by inversely tracking back the above mentioned process, that is the arm 21 is further rotated anticlockwise from the standing state of the arm 21 as shown in FIG. 2, thereby disengaging the latch 20, opening the cover member 19, and then the IC package 12 can be removed.

By the way, in the above-mentioned embodiment, the present invention is applied to the IC socket 11 as "socket for electrical parts", but it can be said that the present invention can be applied to other devices. Further, the above-mentioned embodiment is applied to what is called a "clam shell type" IC socket 11, but the present invention is not limited to this embodiment. The present invention can be applied to an open top type IC socket. Furthermore, the structure of the contactor is not limited to the above-mentioned type of probe pin 17, but can be applied to other probe pins having different structure.

What is claimed is:

1. A socket for an electrical part, which is mounted on a circuit board, comprising:

a socket body on which the electrical part is accommodated; and a plurality of contactors disposed on the socket body to establish an electrical connection between the circuit board and the electrical part, the socket body comprising a contact unit in which the contactors are held, the contact unit comprising:

a first plate disposed at an uppermost position of the contact unit, a second plate disposed at a lower side of the first plate, a fourth plate disposed at a lowermost position of the contact unit, and a third plate disposed at an upper side of the fourth plate, each of the first through fourth plates having a plurality of through holes through each of which the contactors are respectively inserted, and a spacer disposed between the second and third plates and defining a single through hole to receive a plurality of the contactors, a hole size of the through hole of the second plate being larger than a hole size of the through hole of the first plate to form a first stepped portion, a hole size of the through hole of the third plate being larger than a hole size of the through hole of the fourth plate to form a second stepped portion, the first and second stepped portions to prevent the contactors from coming out of the contact unit, and contactors having a different length being accommodated into the contact unit only by replacing the spacer with a spacer of a different thickness.

2. The socket for an electrical part according to claim 1, wherein the socket body comprises a socket frame and the contact unit, the socket frame having an opening capable of accommodating the contact unit, and the contact unit is detachably disposed on the socket frame.

3. The socket for an electrical part according to claim 1, wherein the plates of the contact unit are formed of a same material having an approximately same thermal expansion coefficient as that of an insulating material of the circuit board.

4. The socket for an electrical part according to claim 1, wherein a positioning portion is formed, with respect to the circuit board, on the contact unit, the contact unit being positioned on the circuit board by the positioning portion.

5. The socket for an electrical part according to claim 1, is:

further comprising a positioning portion on the contact unit, the contact unit being positioned on the circuit board by the positioning portion.

6. The socket for an electrical part according to claim 5, wherein the socket body comprises a socket frame and the contact unit, and the socket frame has an opening capable of accommodating the contact unit, and the contact unit is detachably disposed on the socket frame.

7. The socket for an electrical part according to claim 1, the contactor elastically abutting against the circuit board so as to establish an electrical connection therebetween.

8. The socket for an electrical part according to claim 6, wherein the contactors elastically abut against the circuit board so as to establish an electrical connection therebetween.

9. A socket for an electrical part, which is mounted on a circuit board, comprising:

a plurality of contactors to establish an electrical connection between the circuit board and the electrical part;

a first plate;

a second plate; and a spacer disposed between the first and second plates, the first and second plates and the spacer to define a single through hole to receive a plurality of the contactors.

10. The socket for an electrical part according to claim 9, wherein the plurality of contactors pass through the through hole in the spacer without touching the spacer.

11. The socket for an electrical part according to claim 9, further comprising:

a third plate between the first plate and the spacer to form a first stepped portion with the first plate; and a fourth plate between the second plate and the spacer to form a second stepped portion with the first plate, wherein the spacer does not form a stepped portion.

12. A socket for an electrical part, which is mounted on a circuit board, comprising:

a plurality of contactors to establish an electrical connection between the circuit board and the electrical part;

a first plate;

a second plate; and a spacer disposed between the first and second plates, the first and second plates and the spacer to define a continuous through hole to receive a plurality of the contactors.

* * * * *